United States Patent [19]
Bock

[11] Patent Number: 5,682,948
[45] Date of Patent: Nov. 4, 1997

[54] HEAT EXCHANGER FOR COOLING SEMI-CONDUCTOR ELEMENTS OR THE LIKE

[75] Inventor: Uwe Bock, Singen, Germany

[73] Assignee: Alusuisse Technology & Management Ltd., Switzerland

[21] Appl. No.: 603,579

[22] Filed: Feb. 20, 1996

[30] Foreign Application Priority Data

Mar. 24, 1995 [DE] Germany ............... 29505000.4

[51] Int. Cl.⁶ ................................................ H01L 23/36
[52] U.S. Cl. ........................ 165/185; 165/80.3; 361/704
[58] Field of Search .......................... 165/80.3, 185; 361/697, 704, 710; 174/16.3

[56] References Cited

U.S. PATENT DOCUMENTS 4,953,058 8/1990 Harris ........................ 165/80.3 X

FOREIGN PATENT DOCUMENTS

| | | |
|---|---|---|
| 0483058 | 4/1992 | European Pat. Off. . |
| 8429523 | 1/1985 | Germany . |
| 3518310 | 11/1986 | Germany . |
| 9409517 | 9/1994 | Germany . |
| 4314663 | 11/1994 | Germany . |
| 5846660 | 7/1983 | Japan . |
| 5-259673 | 10/1993 | Japan ........................ 361/697 |

Primary Examiner—Allen J. Flanigan
Attorney, Agent, or Firm—Bachman & LaPointe, P.C.

[57] ABSTRACT

Heat exchanger for cooling semi-conductor elements or such equipment, in particular high capacity cooling unit of extruded aluminum or another light weight metal, featuring cooling fins that are connected to a base plate, are spaced apart from each other and are each in the form of a hollow section with two parallel fin walls connected by transverse struts, where the cooling fin is secured in a groove or like recess in the base plate. A free groove is provided beside each occupied groove in the base plate 14 of the heat exchanger and accommodates a counter-lying cooling fin of a second heat exchanger into the base plate of which the cooling fins of the first heat exchanger engage.

11 Claims, 2 Drawing Sheets

HEAT EXCHANGER FOR COOLING SEMI-CONDUCTOR ELEMENTS OR THE LIKE

BACKGROUND OF THE INVENTION

The invention relates to a heat exchanger for cooling semi-conductor elements or such equipment, in particular a high capacity cooling unit of extruded aluminum or another light weight metal, featuring cooling fins that are connected to a base plate, are spaced apart from each other and are each in the form of a hollow section with two parallel fin walls connected by transverse struts; each cooling fin is secured in a groove or like recess in the base plate.

The German patent document DE-PS 35 18 310 describes an extruded solid section with projections on the sides representing cooling fins that engage by virtue of fit in grooves in the base plate. Furthermore, this document mentions so called fin ratios (ratio of height to spacing) of more than 12:1 that consequentially determine the limits of surface area that can be achieved. Both technical and economic considerations require a minimum fin thickness that depends on the height of the fins. Because of the large mount of effort required, it is expensive to produce a heat exchanger with a large number of fins that are at the same time of a thin dimension.

An improvement over the version disclosed in DE-PS 35 18 310 is represented by a similar type of heat exchanger according to EP A 0 483 058 featuring cooling fins running between two flanking walls that, together with the base plate, form a kind of rectangular channel. Both the inner face of the flanking walls and the outer faces of the cooling fins feature ribbing that runs parallel to the base plate.

Both walls of each cooling fin are connected at one end by a coupling head that can be inserted into the groove of the base plate and at the other end by a transverse strut; a further transverse strut at about mid height divides the space between the fins into two channels. The objective in that case was to reduce both the thickness of the cooling fin wall and the expenditure for manufacturing the heat exchanger. A fin ratio of about 30:1 was achieved.

Especially when employing forced air cooling with axially driven coolers the structure of the heat exchanger results in relatively tall fins of small thickness. The cooling efficiency of the fins per unit volume is therefore relatively poor. The distance between the individual fins is intrinsically limited downward to a minimum of 3 mm.

SUMMARY OF THE INVENTION

In view of this state of the art the aim of the invention is to improve the efficiency of cooling per unit volume further. To that end it is necessary to improve the efficiency of the cooling fins and to increase the surface area by means increasing the number of fins and consequently reducing the distance between the fins.

That objective is achieved by way of the invention.

According to the invention a free groove is provided beside each occupied groove in the base plate of the heat exchanger that accommodates a cooling fin, said free groove accommodating a counter lying cooling fin of a second heat exchanger into the base plate of which the cooling fins of the first heat exchanger engage. To that end it has been found favorable for the outside of a known base fin of the base plate flanking the grooves to form a side-wall of a funnel shaped groove, this in order to accommodate the fee end of one of the counter-lying cooling fins of the other radiator. This outer side of the base fin exhibits as limit of the funnel shaped groove a sloping surface with a continuing side-wall inclined at an acute angle to the plane of the bottom of the groove.

According to another feature of the invention the bottom of the funnel shaped groove runs a distance apart from the neighboring groove, preferably rectangular in cross-section, at a lower height i.e. that funnel shaped groove is formed into the base plate at a lower level.

The free end of the cooling fin, according to the invention formed by a pair of end struts with intervening space, is inserted into that funnel shaped groove, as a result of which these end struts are sprung to a limited degree.

Also within the scope of the invention is that the cooling fin is sub-divided by a plurality of transverse struts into a plurality of flow channels and the hydraulic diameter of each of the flow channels is four times the dear surface area divided by the circumference or the channel surface, and is therefore approximately equal to the hydraulic diameter of a channel running between the cooling fins.

The surface of the flow channel may be increased by means of integral parallel strips formed on the inner surface delimiting the flow channels. Furthermore, the parallel strips on one fin wall may be displaced in height with respect to those on the other fin wall.

The state of the art heat exchanger is provided on both sides of the base plate with flanking walls projecting approximately parallel to the cooling fins and the length of the cooling fins.

According to the invention, the housings of the two heat exchangers that are fitted together compliment each other, for which purpose the head of one flanking wall exhibits at least one groove running approximately parallel to the cooling fins, into which groove a spring formed on the head of the counterlying heat exchanger can be inserted.

In this case the flanking walls are about half the length of that of the cooling fins.

As the heat source is in contact with both base plates, only half the length of the cooling or hollow fins is decisive for the measure of effectiveness of the fins. Because of the resultant marked improvement in the effectiveness of cooling, and the large surface area per unit volume, a heat exchanger having very high cooling capacity is achieved.

BRIEF DESCRIPTION OF THE DRAWINGS

Further advantages, features and details of the invention are revealed in the following description of an exemplified embodiment of the invention and by way of the drawing which shows in.

DETAILED DESCRIPTION OF PREFERRED EMBODIMENTS

Figure 1:
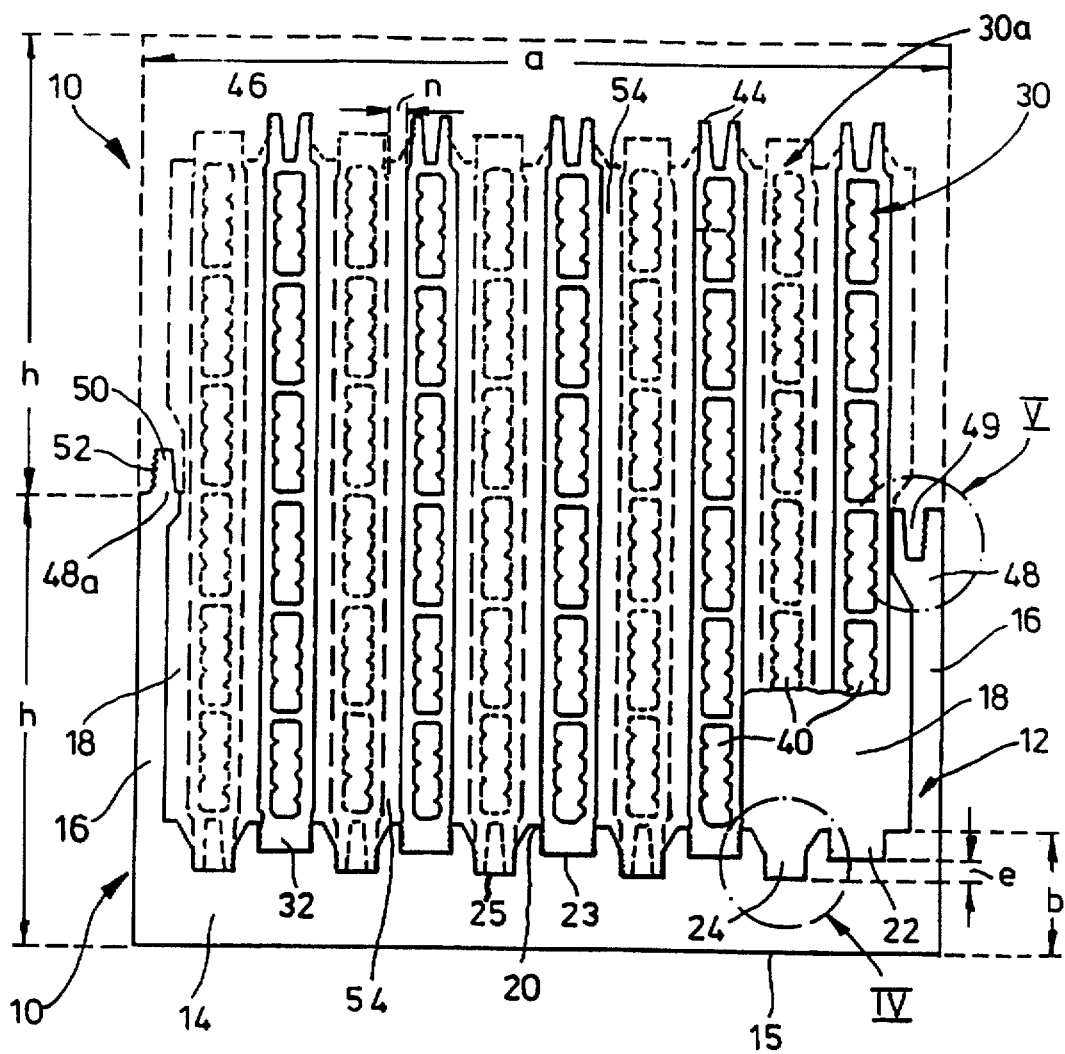
FIG. 1: the front elevation of a cooling unit with high cooling capacity comprising two heat exchangers having cooling fins in a housing.
Figure 2:
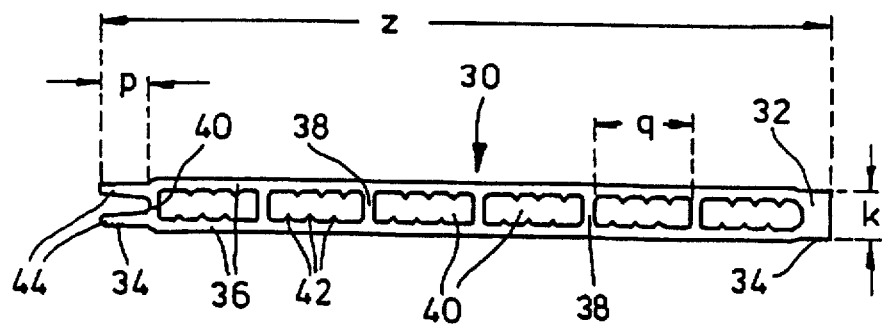
FIG. 2: a single cooling fin of the heat exchanger.

As shown in FIG. 1, a high capacity cooling unit made of aluminum, in particular the alloy AlMgSi0.5 F 22, for cooling semi-conductor elements, for reasons of clarity not shown here in the drawing, exhibits two heat exchangers 10 each with a housing 12 comprising a base plate 14 of breadth a, here 84 mm, and thickness b for example of 13 mm and on both sides of the base plate 14 integral flanking walls 16. The latter form, together with the base plate 14, an extruded rectangular channel. In the present, selected example the height h of this rectangular channel or housing 12 is 47.5 mm.

Shaped into the base plate 14 and facing the interior 18 are grooves 22, 24 which are separated by base fins 20; the grooves 22, 24 are alternatingly rectangular and funnel shaped in cross-section, the lowest surface 23 of the rectangular groove 22 being a distance e higher than the lowest surface 25 of the funnel shaped groove 24.

Figures 4, 5:
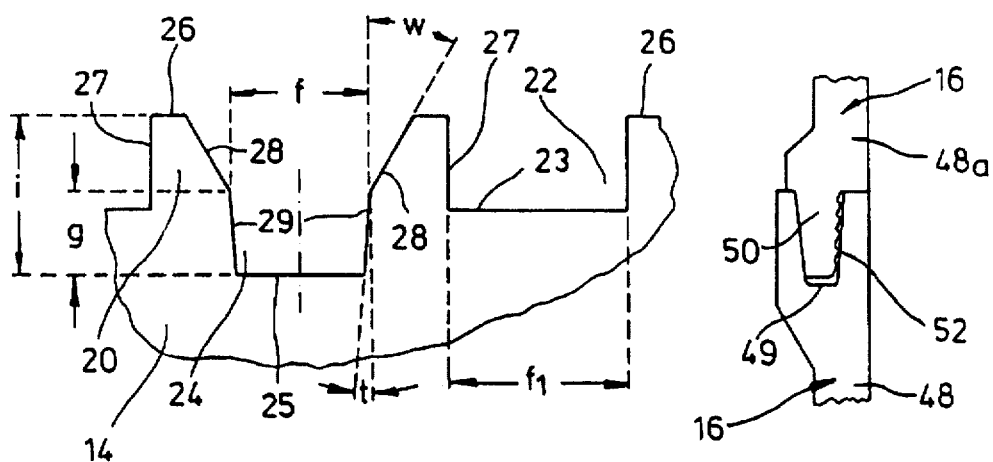
FIGS. 4 & 5: enlarged sections of the housing corresponding to the areas IV and V in FIG. 1.

As can be seen especially in FIG. 4, a top surface 26, running parallel to the bottom face 15 of the base plate 14, meets at a right angle the side face 27 of the rectangular groove 22 and a sloping face 28 inclined at an angle w of 30° which continues as another side-wall 29 which is almost parallel to the wall 27 mentioned viz., at an angle t of 2°. The width f of the groove 24 at this region of transition is 25 mm, the height g of the side-wall 29 is 2.7 mm here, and the overall depth i of the groove 24 is equal to the width f.

Figure 3:
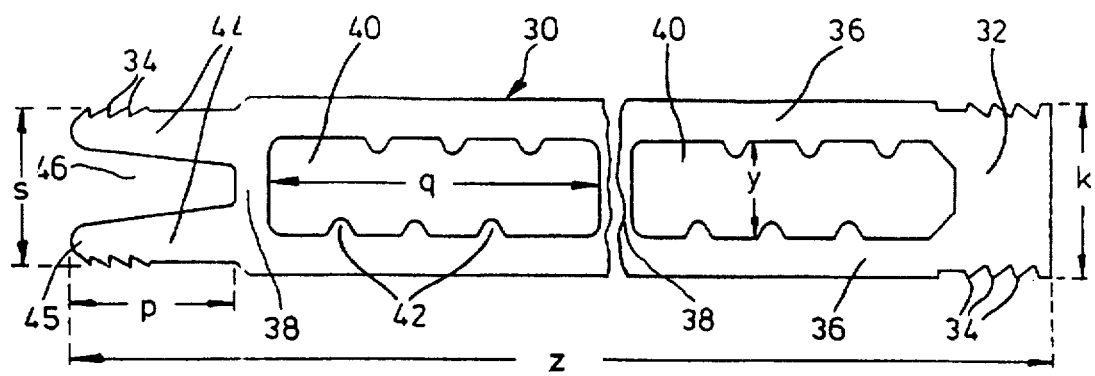
FIG. 3: two enlarged sections of the cooling fin shown in FIG. 2.

The head 32 of breadth k equal to 5.5 mm era hollow or cooling fin 30 of length z equal to 76.6 mm is inserted into each the five grooves 22 of rectangular cross-section, of width $f_1$ equal to 5.7 mm, which are spaced with their central axis A a distance c of 15 mm apart; strips 34 with a tooth-like cross-section are formed on the end of the cooling fins 30 in order to ensure better fit. Extending out from the head 32 are two fin walls 36 that run parallel to the central axis M and are joined together by six transverse struts 38 a clear distance q apart; these delimit section or flow channels 40 of a width y equal to 3 mm. As seen in cross-section, integral parallel strips 42 project out of the fin walls 36; the facing parallel strips 42 are displaced, as can be seen by way of example in FIG. 3.

At the end remote from the head 32 the hollow or cooling fin 30 terminates in a pair of end flanges 44 featuring a plurality of parallel longitudinal strips 34 on the outer face. The end flanges 44 delimit a space 46 that opens outwards and the outer faces form tips 45 that are a distance s of 4.4 mm apart. The base plate 14 and the cooling fins 30 are manufactured separately viz., as extrusions of light weight metal. The cooling fins 30 here five thereof are then mounted parallel to each other and secured by virtue of fit in the grooves 32 of the base plate 14. This way a one-piece radiator 10 is formed featuring the free grooves 24 of funnel shaped cross-section between the mounted cooling fins 30.

A groove 49 is provided in the head 48 at the end of, and in cross-section broader than, one of the flanking walls 16 of housing 12; provided at the end $48_a$ of the other flanking wall 16 is a spring 50 with tooth-like grooved side-wall 52.

Two identical heat exchangers 10 of the kind described above are fitted together by turning one of the heat exchangers round, thus forming a high capacity cooling unit. In that process, the pairs of end flanges 44 at the free end of the cooling fins engage in the corresponding funnel shaped grooves 24 in the other heat exchanger. Only for reasons of clarity are the cooling fins of the heat exchanger 10 inserted from above indicated by $30_a$ and their central axis by $M_1$. The distance $c_1$ between the central axes M and $M_1$ is 7.5 mm.

As the distance s at the end flanges 44 is larger than the width f at the rectangular part of the funnel shaped groove 24, both parts are held together under pressure because of the spring action of the end flanges 44 created at assembly when pressure is applied to the base plates 14 of both heat exchanger. In the same manner, the springs 50 on the flanking walls 16 engage in the grooves 49 on the other, corresponding flanking walls 16.

This design of the high capacity cooling unit permits a very small gap width n between the cooling fins 30 and $30_a$, a width that may be smaller than the dimension k of the cooling fin 30, $30_a$ that can be achieved by extrusion. In order to avoid different hydraulic diameters with unfavorable flow ratios, each cooling fin 30, $30_a$ is, as explained, subdivided by the transverse struts 38 into a plurality of section or flow channels 40 in such a manner that the hydraulic diameter of the individual flow channel 40 at four times the clear surface divided by the circumference is approximately equal to the hydraulic diameter of two times the clear gap width n of the channel 54 running between the cooling fins 30 $30_a$. In order to increase the circumference or the surface of the flow channels 40 in the cooling or hollow channel 30, $30_a$, the above mentioned integral parallel strips 42 are provided, displaced with respect to each other, on the inner walls; this way provision is made for the same pressure relationship and uniform passage of air.

I claim:

1. Heat exchanger for cooling semi-conductor elements or such equipment, which comprises:
    a first and second heat exchanger, each having a base plate with a plurality of parallel grooves therein, cooling fins on each heat exchanger having a coupling socket on one end and a free end on the opposed end, said cooling fins being connected to said respective base plates wherein said fins are spaced apart from each other and are each in the form of a hollow section with two parallel fin walls connected by transverse struts;
    wherein the coupling sockets of the cooling fins of the first heat exchanger engage in said grooves of said first heat exchanger to form occupied grooves in the first heat exchanger, including a free groove beside each occupied groove; and
    wherein the free ends of the cooling fins of said second heat exchanger engage free grooves of the first heat exchanger to provide counter-lying cooling fins of the first and second heat exchanger.

2. Heat exchanger according to claim 1, wherein the base plate of the first heat exchanger includes base fins flanking the occupied grooves, said base fins having an outer side thereof, wherein the outer side of the base fin forms a side-wall of said free groove which is a funnel shaped groove for the free end of the cooling fins of the second heat exchanger.

3. Heat exchanger according to claim 2, wherein said funnel shaped groove has a lowest face thereof, and wherein the outer side of the base fin features, as limit of the funnel shaped groove, an inclined surface adjoining a side-wall that runs at an acute angle to the plane of the lowest face.

4. Heat exchanger according to claim 2, wherein the bottom of the funnel shaped groove is spaced from the neighboring groove which is rectangular in cross-section.

5. Heat exchanger according to claim 1, wherein the free end of the cooling fins is formed by a pair of flanges delimiting a space.

6. Heat exchanger according to claim 1, wherein the cooling fins are subdivided into a plurality of flow channels by a plurality of transverse struts such that the hydraulic diameter of each of the flow channels is approximately four times the clear surface area divided by the circumference.

7. Heat exchanger according to claim 6, wherein the hydraulic diameter of the flow channel is approximately the same as that of a channel running between the cooling fins.

8. Heat exchanger according to claim 6, wherein the width of the flow channel is greater than the clear distance between the two cooling fins.

9. Heat exchanger according to claim 6, wherein integral parallel strips are formed on the inner, delimiting walls of the flow channel.

10. Heat exchanger according to claim 9, wherein the parallel strips on one wall is offset with respect to those on the other wall.

11. Heat exchanger according to claim 1, with flanking walls projecting out from the base plate at both sides of the cooling fins and running approximately parallel to them, wherein the end of one of the flanking walls exhibits at least one groove running parallel to the cooling fins, into which groove a spring formed on the end of the counter lying mounted heat exchanger may be inserted.

* * * * *